United States Patent [19]
Razeghi et al.

[11] Patent Number: 5,012,476
[45] Date of Patent: Apr. 30, 1991

[54] DEVICE OF SEMICONDUCTOR MATERIALS FORMED ON A SUBSTRATE HAVING A DIFFERENT LATTICE PARAMETER AND APPLICATION TO A LASER

[75] Inventors: Manijeh Razeghi, Gif sur Yvette; Martin Defour, Courbevoie; Franck Omnes; Philippe Maurel, both of Les Ulis; Robert Blondeau, Ablis; Michel Krakowski, Paris, all of France

[73] Assignee: Thomson-CSF, Paris, France

[21] Appl. No.: 313,974

[22] PCT Filed: May 27, 1988

[86] PCT No.: PCT/FR88/00269
  § 371 Date: Jan. 11, 1989
  § 102(e) Date: Jan. 11, 1989

[87] PCT Pub. No.: WO88/10007
  PCT Pub. Date: Dec. 15, 1988

[30] Foreign Application Priority Data
  Jun. 2, 1987 [FR] France .................... 87 07709

[51] Int. Cl.$^5$ ............................................. H01S 3/19
[52] U.S. Cl. ............................................. 372/45; 357/4

[58] Field of Search .................. 372/43, 45; 357/4, 16

[56] References Cited

U.S. PATENT DOCUMENTS

| | | | |
|---|---|---|---|
| 4,639,275 | 1/1987 | Holonyak, Jr. | 148/1.5 |
| 4,727,555 | 2/1988 | Burnham et al. | 372/45 |

FOREIGN PATENT DOCUMENTS

| | | | |
|---|---|---|---|
| 0019003 | 11/1980 | European Pat. Off. | |
| 0221531 | 5/1987 | European Pat. Off. | |
| 2371780 | 6/1978 | France. | |
| 62-55985 | 3/1987 | Japan | 372/43 |
| 62-73688 | 4/1987 | Japan | 372/43 |

Primary Examiner—Frank Gonzalez
Attorney, Agent, or Firm—Oblon, Spivak, McClelland, Maier & Neustadt

[57] ABSTRACT

A device for use as a laser includes a component (C) of semiconductor material formed on a substrate (1) having a different lattice parameter. The substrate (1) is covered with a silicon layer (2) which is in turn covered with a matching superlattice (3) on which the component (C) is formed. The device is more particularly applicable to a component formed on diamond.

11 Claims, 2 Drawing Sheets

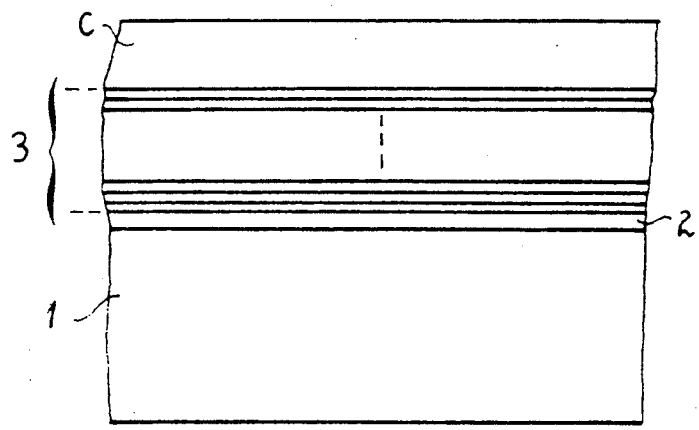
FIG_1
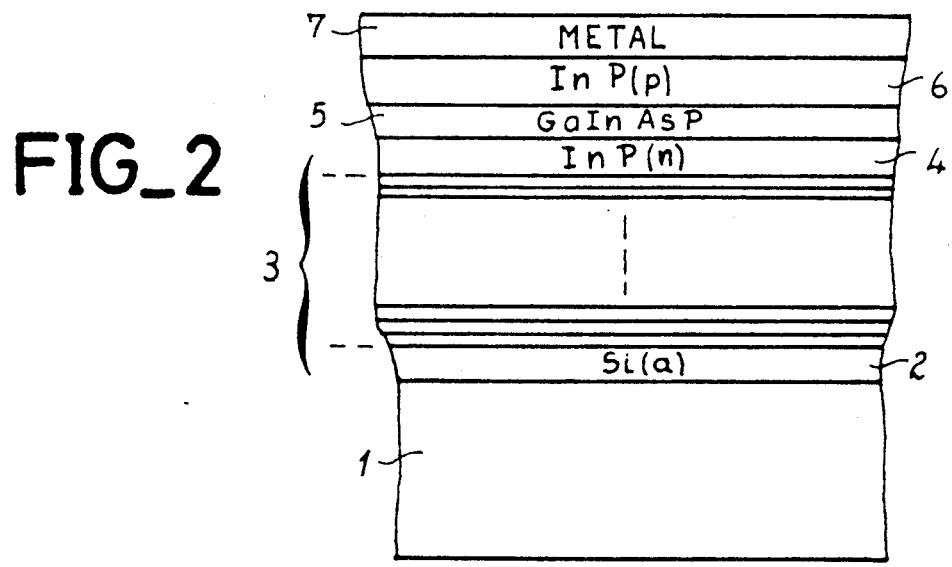
FIG_2
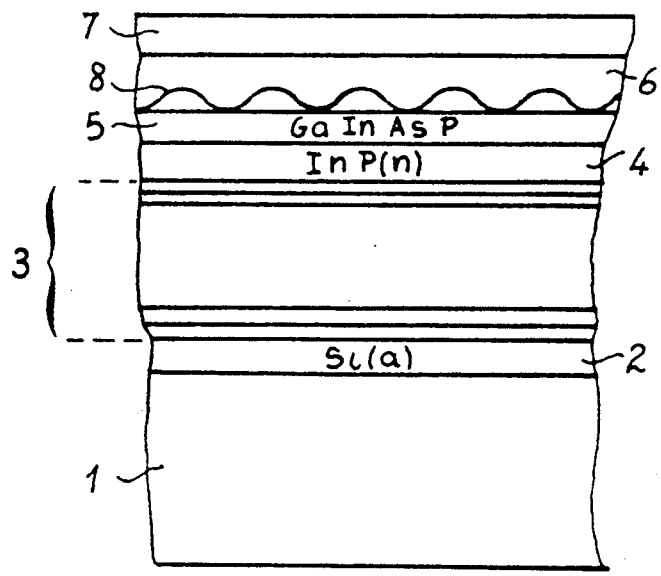
FIG_3

FIG_4
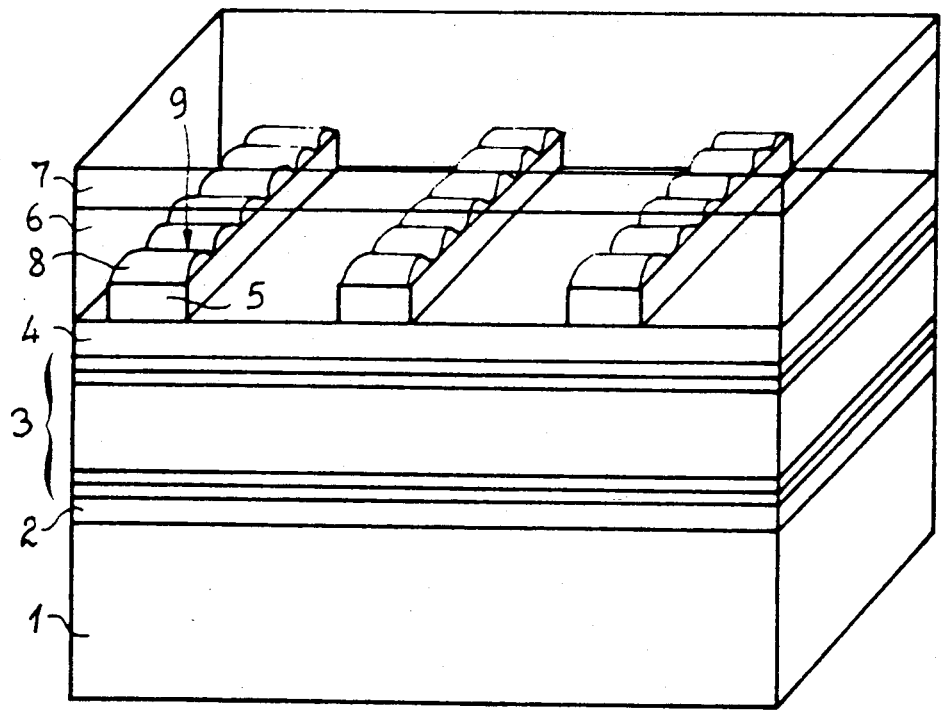
FIG_5
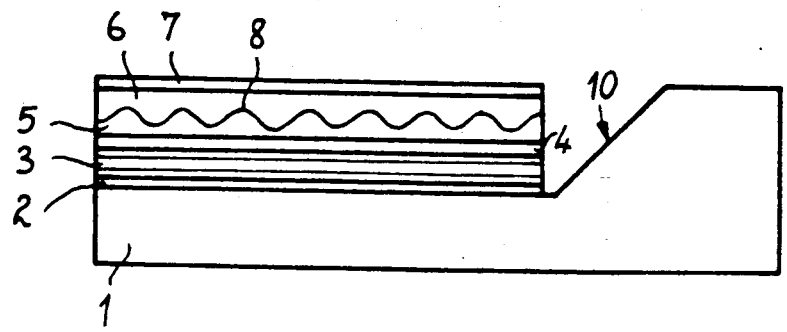

DEVICE OF SEMICONDUCTOR MATERIALS FORMED ON A SUBSTRATE HAVING A DIFFERENT LATTICE PARAMETER AND APPLICATION TO A LASER

The invention relates to a device of semiconductor materials formed on a substrate having a parameter which is different from that of the semiconductor materials of the device.

A study of the thermal properties of diamond shows that, on the one hand, the thermal conductivity is twice that of copper and that, on the other hand, the coefficient of thermal expansion is five times less than that of copper.

This is clearly apparent from the table given below in which the characteristics of diamond, of boron nitride T-CBN (Transparent Cubic Boron Nitride) and copper are compared.

| | thermal conductivity | | thermal expansion | resistivity | dielectric constant |
|---|---|---|---|---|---|
| | RT | 140° C. | RT 400° C. | $\Omega \cdot cm$ | at 1 MHZ |
| diamond | 9 | 5 | $2.3 \times 10^{-6}/C.$ | $10^{16}$ | 5.7 |
| T-CBN | 6.0 | 6.5 | $3.7 \times 10^{-6}/C.$ | $>10^{11}$ | 6.5 |
| Cu | 3.9 | 3.9 | $17.0 \times 10^{-6}/C.$ | | |

Success has recently been achieved in the production of diamonds doped with boron. When the quantity of boron is larger than 100 ppm, diamond becomes conductive and, in the case of a quantity smaller than 100 ppm, it becomes semiconducting.

At the present time, synthetic diamonds are employed as supports for optoelectronic components.

However, the use of diamond or boron nitride T-CBN for implanting semiconductor components was unthinkable since the problem to be solved was a problem of lattice mismatch.

The invention consists in employing insulating or semiconducting diamond as a substrate and in fabricating the integrated circuits by employing ion implantations as is at present the practice on the Si substrate.

Furthermore, the invention consists in employing semi-insulating or conductive diamond as substrate, in forming the III-V or II-VI semiconductor materials (heterojunction, superlattices) by direct epitaxial deposition in order to fabricate optoelectronic components such as laser, photodiode, photocathode, solar cell . . . and the microwave components such as GUNN diode, IMPATT diode, FET transistor.

The invention therefore relates to a device of semiconductor materials, characterized in that it comprises:
a diamond substrate;
at least one silicon layer deposited on one face of the substrate;
a series of layers of semiconductor compounds forming a matching superlattice, which are deposited on the silicon layer and in which the layers located nearest the silicon layer have a first lattice parameter which is little different from that of the silicon layer and in which the most distant layers have a second lattice parameter;
a component of semiconductor material in which at least the layer located nearest the superlattice has a lattice parameter which is little different from that of the second lattice parameter.

The invention is also concerned with a method of construction of a device in accordance with any one of the preceding claims, characterized in that it involves the following steps:
a first step of formation by low-temperature epitaxy of a layer of amorphous silicon on the substrate;
a second step of heating which facilitates the distribution of the nucleations;
a third step of formation by epitaxy of a matching layer on the amorphous silicon layer;
a fourth step of formation by epitaxy of a component of semiconductor material.

The different objects and characteristics of the invention will appear in greater detail in the following description which is given by way of example with reference to the accompanying figures and in which:

FIG. 1 represents an example of construction of a device in accordance with the invention;

FIG. 2 represents an example of construction of a semiconductor laser in accordance with the invention;

FIG. 3 represents an example of construction of a distributed feedback (DFB) laser structure;

FIG. 4 represents an example of construction of a distributed-feedback power laser;

FIG. 5 represents an example of construction of a distributed-feedback laser comprising a reflecting mirror.

Diamond has excellent properties of electrical insulation and thermal conduction.

By doping diamond with boron with a dopant concentration of less than 100 ppm, a p-type semiconductor material is obtained. By carrying out doping of diamond with boron at a concentration higher than 100 ppm, the diamond becomes conductive.

The invention is therefore intended to turn to profitable account the properties of good thermal conduction of diamond in order to use this latter as a substrate in the fabrication of semiconductor components. However, the implantation of semiconductor materials in diamond gives rise to problems of mismatching as a result of the different lattice parameters.

In order to solve these problems, the invention proposes as shown in FIG. 1 to form on the diamond 1 a layer 2 of amorphous silicon. After annealing, this amorphous silicon layer will have substantially the same lattice parameter as the diamond and will facilitate nucleation.

In consequence, heating is then carried out to a temperature such as 500° or 600° C., for example, in order to have a distribution of nucleations on the diamond.

Said silicon layer can be formed by epitaxy at a very low temperature, for example 300° C.

On the silicon layer 2 is formed a matching layer such that this layer is matched in lattice parameter with the silicon layer and that a layer of semiconductor material of a component C is matched in lattice parameter with said matching layer.

Said matching layer is constructed in the form of a superlattice.

Although it is not always mandatory in all cases, provision can be made for an annealing operation at this stage of the process.

By way of example, the amorphous silicon layer can have a thickness of approximately 100 Angströms.

In FIG. 2, the component formed is a semiconductor laser constituted by a first n-doped confinement layer 4, an active layer 5, a second p-doped confinement layer 6 and a contact layer 7.

The laser illustrated is formed of III-V material of the Periodic Table of Elements. By way of example, the confinement layers are of indium phosphide InP and the active layer is of arsenic phosphide, indium phosphide and gallium phosphide.

In order to achieve lattice matching of this laser, the superlattice 3 is constituted by layers which are different in alternate succession so that the lattice parameter of that part of the superlattice which is in contact with the silicon layer 2 has substantially the same lattice parameter as silicon whilst that part of the superlattice which is in contact with the first confinement layer 4 has substantially the same lattice parameter as said confinement layer.

The superlattice is thus formed of material of the III-V type and, by way of example, is formed of layers of GaAs and GaInP or of layers of GaAs and GaInAs.

Whereas the silicon layer 2 has a thickness of approximately 100 Angströms, each layer of the superlattice 3 has a thickness of approximately 50 Angströms. The entire superlattice has a thickness substantially of 2000 Angströms.

The laser formed on the superlattice 3 can also be formed of semiconductor material of the II-VI type and the superlattice 3 is in that case also formed of semiconductor material of the II-VI type.

In the foregoing, there have been described examples of construction in which the substrate is diamond. The invention is also applicable to a device in which the substrate is a material of the type T-CBN (Transparent Cubic Niobium Boron Nitride). A substrate of this type receives a layer 2 of amorphous silicon.

A component is then formed on the layer 2 of amorphous silicon as described earlier. In particular, provision is also made for a matching superlattice 3.

The semiconductor materials employed and the thicknesses of the different layers are as described earlier. Similarly, the formation of the different layers can be carried out as before.

The present invention also relates to a photoemitter semiconductor device of the high-power laser type (1 to 10 W) with guiding by refractive index and makes use of a distributed feedback (DFB) lattice. Over the past few years, these devices have aroused great interest since they operate at a considerable power value (1 to 10 W). They permit in particular the construction of monomode power lasers which operate at 0.8 $\mu$m, 1.3 $\mu$m or 1.55 $\mu$m. A description of a laser of the DFB type will be found in the article "Low-threshold distributed feedback lasers fabricated on material grown completely by LP-MOCVD" by M. Razeghi et al. published in IEEE Journal of Quantum Electronics, Volumes QE-21, No. 6, June 1985.

The advantage of the present invention with respect to the other semiconductor power laser structures is that the thermal conductivity of diamond is twice as great as that of copper.

These devices can be employed on the one hand for replacing gas lasers and on the other hand for pumping YAG lasers.

FIG. 3 illustrates a laser structure of this type. There is again shown in this figure:
the substrate 1;
the amorphous silicon layer 2;
the matching superlattice 3;
the confinement layer 4;
the active layer 5.

In addition, the active layer 5 is covered with a guiding layer 8 constructed in the form of a distributed lattice which makes it possible to obtain the laser effect.

The guiding layer 8 is covered with the confinement layer 6 and the contact layer 7.

FIG. 4 illustrates a power laser which applies the structure of FIG. 3.

In this figure, the same layers as those of FIG. 3 are again shown. In addition, parallel strips 9 have been etched in the active layer 3 and the guiding layer 8. Etching of the strips 9 has been carried out in such a manner as to ensure that their direction is perpendicular to the direction of the grooves of the distributed lattice which makes it possible to obtain the laser effect. These different strips emit phaselocked beams.

By way of example, each strip has a width of 1 micrometer and the distance between two strips is two to three micrometers.

FIG. 5 illustrates a laser of this type as described earlier which comprises within the substrate 1, at one end of the laser, a plane 11 which is inclined with respect to the emission plane of the laser, for example at 45°. This inclined plane 11 is reflecting, with the result that the emitted laser beam can readily be directed towards utilization devices (not shown).

The invention also has for its object a method of fabrication of at least one semiconductor device of the type consisting of a high-power monomode (DFB) double heterojunction laser with guiding by refractive index. The device is fabricated from a boron-doped diamond substrate. It comprises the following steps:

a first step of deposition of epitaxial layers on said diamond substrate 1, involving successively:
(a) deposition of an amorphous silicon layer 2 followed by an annealing operation;
(b) deposition of a series of superlattices 3 having a base of III-V semiconductor materials for eliminating the dislocations caused by crystal lattice mismatches between the diamond substrate and the III-V semiconductor employed for the fabrication of the laser which can also (although this is not mandatory) be followed by an annealing operation;
(c) deposition of a first n-doped confinement layer 4, an active layer 5, a waveguide layer 8;
a second step which consists in forming a Bragg grating by holography and chemical etching in the waveguide layer 8;
a third step which consists in forming strips 9;
a fourth step which consists in epitaxial deposition of the doped confinement layer 6 and of the contact layer 7;
a fifth step comprising deposition of metallic contacts on the contact layer and on the face of the substrate.

The method described in the foregoing can be followed by etching, at one end of the laser obtained, of a reflecting plane 11 which is inclined with respect to the emission plane of the laser at 45°, for example.

It is to be noted that the different depositions mentioned above can be carried out by epitaxy of monoatomic layers.

It is readily apparent that the foregoing description has been given solely by way of non-limitative example. The numerical examples in particular and the types of materials which can be employed have been indicated only in order to illustrate the description. Other variants may be contemplated without departing from the scope of the invention.

We claim:

1. Device of semiconductor materials comprising:
   a diamond substrate (1);
   at least one silicon layer (2) deposited on one face of the substrate;
   a series of layers of semiconductor compounds forming a matching superlattice (3), which are deposited on the silicon layer (2) and in which layers thereof located nearest the silicon layer (2) have a first lattice parameter which is little different from that of the silicon layer (2) and in which most distant layers thereof have a second lattice parameter;
   a component of semiconductor material (c) juxtaposed to the superlattice (3) in which at least a layer thereof located nearest the superlattice (3) has a lattice parameter which is little different from that of the second lattice parameter.

2. Device in accordance with claim 1, wherein the diamond substrate (1) is doped with boron.

3. Device of semiconductor materials comprising:
   a substrate (1) of transparent cubic boron nitride (T-CBN);
   at least one amorphous silicon layer (2) deposited on one face of the substrate;
   a series of layers of semiconductor compounds forming a matching superlattice (3) which are deposited on the amorphous silicon layer (2) and in which layers thereof located nearest the amorphous silicon layer (2) have a first lattice parameter which is matched with that of the amorphous silicon layer (2) and in which most distant layers thereof have a second lattice parameter;
   a component of semiconductor material (c) juxtaposed to the superlattice (3) in which at least a layer thereof located nearest to the superlattice (3) has a lattice parameter which is matched with that of the second lattice parameter.

4. Device in accordance with one of claims 1 or 3, in which the superlattice (3) comprises an alternate succession of layers of different types, the compositions of which vary between the amorphous silicon layer (2) and the component (C) so as to achieve lattice matching, wherein one of the types of layers is of indium phoside (InP).

5. Device in accordance with one of claims 1 or 3, wherein the component (C) is a laser diode provided on the superlattice (3) with a first confinement layer (4), an active layer (5), a second confinement layer (6), and a contact layer (7).

6. Device in accordance with claim 5, wherein the first confinement layer (4) is of n-doped indium phosphide, the active layer is of material of III-V compounds forming a quantum well, the second confinement layer (5) is of p-doped indium phosphide.

7. Device in accordance with claim 5, wherein the active layer (5) is a succession of monoatomic layers of indium arsenide (InAs) and indium antimonide (InSb).

8. Device in accordance with claim 5, wherein the active layer (5) is a superlattice of indium arsenide (InAs) and gallium antimonide (GaSb).

9. Device in accordance with claim 5, wherein the active layer 5 is a superlattice of indium arsenide (InAs) and indium antimonide (InSb).

10. Device in accordance with claim 5, wherein a guiding layer (8) is provided between the active layer (5) and the second confinement layer (6), the guiding layer (8) being constructed in the form of a distributed lattice and wherein a number of laser emission strips (9) parallel to each other are formed in the active layer (5) and the guiding layer (8), a longitudinal direction of these strips being perpendicular to the direction of the etchings of the lattice.

11. Device in accordance with claim 10, wherein, at one end of the device, a reflecting plane is provided which is inclined with respect to an emission plane of the laser.

* * * * *